US006190991B1

(12) United States Patent
Beitel et al.

(10) Patent No.: US 6,190,991 B1
(45) Date of Patent: Feb. 20, 2001

(54) METHOD FOR FABRICATING A CAPACITOR

(75) Inventors: Gerhard Beitel; Elke Fritsch, both of München; Hermann Wendt, Grasbrunn, all of (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/428,181

(22) Filed: Oct. 27, 1999

(30) Foreign Application Priority Data

Oct. 27, 1998 (DE) ............................................ 198 49 542

(51) Int. Cl.[7] .................................................... H01L 21/70
(52) U.S. Cl. ............................ 438/396; 438/238; 438/3; 438/240; 438/592; 438/735
(58) Field of Search ............................... 438/240, 3, 238, 438/397, 735, 734, 396, 712, 210, 592

(56) References Cited

U.S. PATENT DOCUMENTS

| | | | |
|---|---|---|---|
| 5,335,138 | 8/1994 | Sandhu et al. . | |
| 5,504,041 | 4/1996 | Summerfelt . | |
| 5,554,866 | 9/1996 | Nishioka . | |
| 5,559,666 | 9/1996 | Figura et al. . | |
| 5,585,998 | 12/1996 | Kotecki . | |
| 5,605,858 * | 2/1997 | Nishioka et al. | 437/60 |
| 5,621,606 | 4/1997 | Hwang . | |
| 5,633,781 | 5/1997 | Saenger . | |
| 5,656,852 | 8/1997 | Nishioka . | |
| 5,679,982 * | 10/1997 | Gardner | 257/758 |
| 5,731,634 * | 3/1998 | Matsuo et al. | 257/752 |
| 5,808,854 * | 9/1998 | Figura et al. | 361/321.4 |
| 5,956,614 * | 9/1999 | Liu | 438/656 |
| 6,008,515 * | 12/1999 | Hsia et al. | 257/309 |
| 6,010,744 * | 1/2000 | Buskirk et al. | 427/81 |
| 6,020,024 * | 2/2000 | Maiti et al. | 427/248.1 |

FOREIGN PATENT DOCUMENTS

| | | |
|---|---|---|
| 195 15 347A1 | 11/1995 | (DE) . |
| 198 52 256 A1 | 5/1999 | (DE) . |
| 0726600A2 | 8/1996 | (EP) . |
| 0739030A2 | 10/1996 | (EP) . |

OTHER PUBLICATIONS

Won–Jae Lee et al.: "Ir and Ru bottom electrodes for (Ba,Sr)$TiO_3$ thin films deposited by liquid delivery source chemical vapor deposition", Thin Solid Films 323 (1998) pp. 285–290.

"Integration of (Ba,Sr)$TiO_3$ Capacitor with Platinum Electrodes Having $SiO_2$ Spacer" (Byoung Taek Lee et al.), dated 1997, pp. 249–252.

"A Stacked Capacitor Technology with ECR Plasma MOCVD (Ba,Sr)$TiO_3$ and $RuO_3$/Ru/TiN/$TiSi_x$ Storage Nodes for Gb–Scale DRAM's" (Yamamichi et al.), dated 1997, pp. 1076–1081.

* cited by examiner

*Primary Examiner*—Matthew Smith
*Assistant Examiner*—V. Yevsikov
(74) *Attorney, Agent, or Firm*—Herbert L. Lerner; Laurence A. Greenberg; Werner H. Stemer

(57) ABSTRACT

A method for fabricating a capacitor includes the formation of a self-aligned and essentially amorphous passivation edge web. The passivation edge web is formed in the course of a BST vapor phase deposition after prior etching of the lower metal electrode and of the barrier layer, the TEOS layer situated under the barrier layer being attacked by said etching. By means of targeted material redeposition on the side walls of the lower electrode and of the barrier layer, the passivation edge web is subsequently formed from this material deposition.

12 Claims, 2 Drawing Sheets

30 60 85 55 50 57 35 25 10 12 70 65 80 5

20
15
10
25
5
12

35
30
27
40
40
12
5

35
30
55
50

METHOD FOR FABRICATING A CAPACITOR

BACKGROUND OF THE INVENTION

Field of the Invention

The present invention lies in the field of semiconductor technology and, more specifically, relates to a method for fabricating a capacitor.

In order to further increase the integration level in semiconductor modules, materials having a high dielectric constant (high-ε)or having ferroelectric properties will be used to an increased extent in the future. By using these materials, it is hoped that a higher storage density (charge/area) will be gained in comparison with the capacitor dielectrics (oxide/nitride/oxide) used heretofore. A preferred material having a high dielectric constant is barium strontium titanate (BST) for example. Examples of ferroelectric materials that ought to be mentioned in the context are strontium bismuth tantalate (SBT) and also lead zirconium titanate (PZT).

However, the process integration of these materials entails a series of problems. Particular difficulties are posed by the deposition. The materials used as capacitor dielectric (metal oxide layers in ceramic form) can, for example, be applied conformally to a semiconductor surface by means of CVD deposition processes. The metal oxide layers are thereby applied inter alia directly to a first electrode of a storage capacitor. The material used for that electrode must be resistant to oxygen, since the metal oxide layer is deposited in an oxidizing atmosphere. Platinum and ruthenium, among others, have proved to be suitable electrode materials. One disadvantage of these materials, however, is that they exhibit a high level of diffusion into silicon or form metal silicide layers with silicon. Those layers can have an irreversible influence on the method of operation of active components.

Therefore, it is usual for a so-called barrier layer to be arranged underneath the electrode materials. The barrier layer prevents the electrode materials from diffusing into the silicon situated underneath. Barrier layers of this type are composed of a titanium/titanium nitride combination, for example.

It is unfavorable, however, that these barrier layers are sensitive to oxidation and can easily oxidize in the course of the CVD deposition of the metal oxide layers. Particularly when titanium is used as a constituent part of the barrier layer, there is the risk, therefore, that the usually conductive barrier layer will become insulating as a result of the oxidation. It is thus no longer possible to make contact with the first (lower) electrode of the storage capacitor.

In order to prevent the oxidation of the barrier layer during the CVD deposition, U.S. Pat. Nos. 5,883,781 and 5,943,547 (European patent application EP 0 739 030 A2), for example, propose the formation of lateral insulation webs around the patterned barrier layer. The insulation webs, which are composed of silicon nitride, are formed after the common etching of the lower electrode and also of the barrier layer by means of conformal deposition of a silicon nitride layer and anisotropic etching thereof. The silicon nitride layer thereby essentially remains in the lower region of the electrode, that is to say only in the region of the barrier layer.

Lateral insulation webs around the barrier layer are also proposed in U.S. Pat. No. 5,656,852. The insulation webs, which may be composed of silicon dioxide or silicon nitride are formed there prior to the deposition of the lower metal electrode.

A common feature of all of the prior art insulation webs is that they are formed from a conformally deposited insulation layer with subsequent anisotropic etching. The necessary etching step, in particular, may thereby attack the barrier layer and/or the electrode or one of these two layers may be contaminated by the insulation layer.

The contamination of the metal electrode, in particular, is disadvantageous since the material properties of the metal oxide layer to be applied to the metal electrode depend to a great extent on the quality of the interface between metal electrode and metal oxide layer.

By contrast, insulation webs formed in situ are disclosed in U.S. Pat. No. 5,554,844, in which a titanium nitride layer serving as a barrier is oxidized in its side regions prior to the deposition of the capacitor dielectric. Since the oxidation of the barrier layer progresses rapidly in particular with respect to the adjoining metal electrode, problems concerning the adhesion of the metal electrode on the barrier may arise.

SUMMARY OF THE INVENTION

It is accordingly an object of the invention to provide a capacitor fabrication method, which overcomes the above-mentioned disadvantages of the heretofore-known devices and methods of this general type and which precludes contamination of layers already present to the greatest possible extent, ensures reliable adhesion of the metal electrode, and is simple to realize in technological terms.

With the foregoing and other objects in view there is provided, in accordance with the invention, a method for fabricating a capacitor, which comprises the following steps:

- providing a substrate with a silicon-containing oxide layer, a barrier layer on the oxide layer, and an electrode layer on the barrier layer;
- etching, region by region, the electrode layer and the barrier layer (either in a common or in subsequent etching steps), for forming at least one capacitor electrode, and thereby attacking the oxide layer underneath the barrier layer at least up to a predetermined degree;
- CVD-depositing at least one metal in an oxidizing atmosphere and at a given deposition temperature to form a metal oxide layer, and thereby producing in situ a substantially amorphous passivation edge web, in the course of the CVD deposition, laterally of the barrier layer between the barrier layer and the metal oxide layer.

In accordance with an added feature of the invention, the metal oxide layer is thermally annealed to form a polycrystalline layer.

The invention is based on the insight that given a suitable selection of the process parameters, in particular with regard to the etching operation and the CVD deposition, a self-aligned passivation edge web is formed around the barrier layers. For this purpose, it is necessary, on the one hand, that in the course of the etching of the electrode and of the barrier layer or in the course of an additional etching step, the oxide layer situated under the barrier layer is attacked up to a specific degree. This etching of the oxide layer results in a degree of material erosion of the oxide layer laterally with respect to the already etched electrode and the barrier layer. In this case, part of the eroded material is redeposited on the side walls of the barrier layer and also of the electrode layer. In the course of the subsequent deposition of the metal oxide layer from a CVD vapor phase, an amorphous passivation edge web is formed from the material that is redeposited there, said passivation edge web protecting the barrier layer against oxidation during the further CVD deposition. Since this passivation edge web is formed during the CVD deposition, it is possible for the barrier layer to be oxidized up to a certain degree at its edges. As a result of the passivation edge web, which forms relatively rapidly, however, advancing oxidation of the barrier layer is retarded with the increasing formation of said passivation edge web, so that it is possible to talk of a self-retarding oxidation barrier.

With the deposition of the metal oxide layer advancing further, the further formation of the passivation edge web is also retarded. The reason for this, on the one hand, is that only a limited quantity of the deposited metal oxides can be taken up by the redeposited material. Another reason is to be found in the increasing coverage of the redeposited material with the deposited metal oxides. In principle, the passivation edge web that is produced has a certain material thickness depending on the quantity of redeposited material and the process conditions selected.

In addition to the deposited material, on the other hand, the vapor phase itself also contributes to the formation of the passivation edge web. During the CVD deposition, the deposited metals or metal oxides penetrate up to a certain degree into the redeposited material, possibly also into the barrier layer, and form an amorphous mixed oxide there. This mixed oxide thus has constituent parts of the barrier, of the silicon-containing oxide layer and also of the deposited metal oxide layer.

The layer thickness and extent of the passivation edge web can be controlled, in addition to the variation of the etching depth in the silicon-containing oxide layer, also by variation of the steepness of the etching side walls and also of the deposition temperature of the CVD deposition. Given typical process parameters, the passivation edge web is approximately twice as thick as the deposited metal oxide layer. If the intention is to make the passivation edge web thicker, then it is recommended to etch the silicon-containing oxide layer to a greater extent. Conversely, in addition to a reduced etching depth, a lower deposition temperature may also be striven for in order to reduce the thickness of the passivation edge web.

The method according to the invention makes it possible to dispense with separately fabricated insulation edge webs. This reduces the number of process steps, on the one hand, and precludes undesirable contamination of the lower electrode, on the other hand. Furthermore, simple control of the extent of the passivation edge web is made possible. By way of example, it is possible to limit the formation of the passivation edge web to the lateral region with respect to the barrier layer, with the result that the side walls of the electrode arranged above the barrier layer are not covered by the passivation edge web and are available as effective capacitor area for storing charge.

Moreover, the coverage of the electrode with the passivation edge web is not absolutely necessary since the electrode protects the barrier layer during the CVD deposition in an oxidizing atmosphere from above to a sufficient extent.

Since the formation of the passivation edge web is essentially limited to the outer edge regions of the barrier layer, sufficient adhesion of the electrode on the barrier layer is ensured. The passivation edge web is formed essentially only where material is deposited. As a result, the barrier layer is protected by a passivation edge web, albeit one that is not yet completely formed, as early as prior to the CVD deposition.

In accordance with an additional feature of the invention, the passivation edge web contains silicon and portions of the metal deposited in the CVD-depositing step. In accordance with another feature of the invention, the silicon-containing oxide layer is formed from TEOS or silicon nitride. It has been shown that the passivation edge webs that form with the use of these layers prove to be particularly effective oxidation barriers.

In accordance with a further feature of the invention, the electrode layer and the barrier layer are etched by reactive ion etching in the presence of chlorine. This can be done in two separate process steps, but preferably in one. Depending on the duration of the etching operation and the associated etching depth in the silicon-containing oxide layer, the deposition temperature during the CVD deposition should be correspondingly adapted, in order that the passivation edge web has the desired thickness.

In accordance with again an added feature of the invention, the deposition temperature and the predetermined degree to which the oxide layer is attacked are coordinated during the etching step such that the passivation edge web formed is approximately twice as thick as the metal oxide layer.

In accordance with again an additional feature of the invention, a mixture of metal and alkaline earth metal complexes containing beta-diketonates is used for depositing the metal oxide layer. The effect of the passivation edge web is particularly effective when the metal oxide layer is deposited from a mixture of metal and alkaline earth metal complexes containing beta-diketonates. Metal complexes of this type are present as volatile substances at the selected deposition temperature and are thus distributed uniformly over the entire surface of the substrate to be processed. Therefore, these metal complexes also reach the side walls of the barrier layer and thus the material redeposited there. Moreover, the beta-diketonate complexes, in particular, exhibit a certain reactivity with regard to the redeposited material.

The deposition of a metal oxide layer in the form of a barium strontium titanate layer (BST) or strontium bismuth tantalate layer (SBT) is particularly preferred. The deposition temperature preferred in that case lies approximately between 400° C. and 600° C. The passivation edge web that forms during the CVD deposition is therefore predominantly composed of titanium oxide or tantalum oxide with proportions of silicon, carbon, barium, bismuth and strontium. It is characteristic here that the proportion of barium and strontium in the passivation edge web is approximately only half as high as, for example, in the barium strontium titanate layer. The chemical composition of the passivation edge web may also be adjusted by varying the stoichiometry during the CVD deposition. Moreover, the deposited metal oxide layer adheres to a sufficient extent on the passivation edge web.

In accordance with again another feature of the invention, after the deposition of the metal oxide layer, at least one further electrode is applied to the metal oxide layer. This can be done inter alia by whole-area deposition of a metal with subsequent patterning. If the metal oxide layer does not yet have the desired polycrystalline structure, it can be subjected to a thermal annealing step before or after the deposition of the further electrode. This changes the polycrystalline structure of the metal oxide layer and thus the dielectric properties of the metal oxide layer. The passivation edge web is not changed during the annealing step.

The passivation edge web formed according to the invention is not merely a direct transition layer between the barrier layer and the metal oxide layer, but rather an intermediate layer that is readily distinguishable from both and has its own structure. This has been demonstrated both by scanning electron microscope and other structural examinations.

Other features which are considered as characteristic for the invention are set forth in the appended claims.

Although the invention is illustrated and described herein as embodied in a method for fabricating a capacitor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
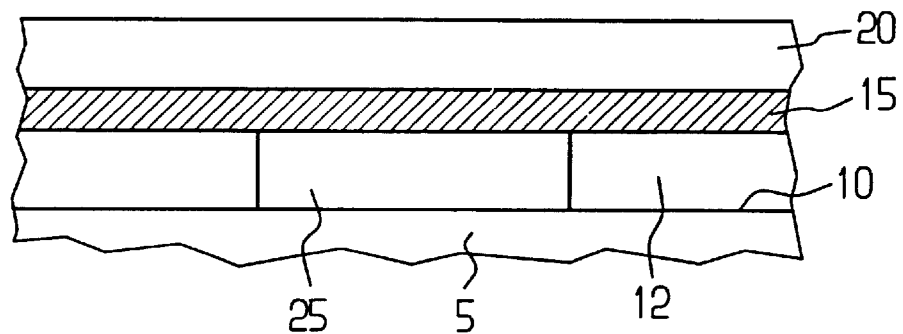
FIGS. 1 to 3 are partial, diagrammatic side views illustrating three sequential method steps for fabricating a passivation edge web.

Referring now to the figures of the drawing in detail and first, particularly, to FIG. 1 thereof, there is seen a substrate 5, on a surface 10 of which there are arranged a silicon-containing oxide layer 12, a barrier layer 15 and also an electrode layer 20. The barrier layer 15 is composed of a titanium nitride-titanium combination, whereas the electrode layer 20 is composed of platinum or another less reactive metal. A TEOS layer 12 (TEOS=tetraethyl orthosilicate) is preferably used as the silicon-containing oxide layer 12. A contact hole 25 is formed in the latter. The contact hole 25 is filled with polysilicon. The contact hole establishes the conductive connection between the electrode layer 20 and an active component (not specifically illustrated here) . The barrier layer 15 is situated between the electrode layer 20 and the contact hole 25 filled with polysilicon in order to prevent the diffusion of platinum into the silicon or the diffusion of silicon into the platinum. The titanium and titanium nitride layer combination serving as the barrier layer 15 was applied by deposition by sputtering, the titanium layer having a thickness of approximately 20 nm and the titanium nitride layer having a thickness of approximately 100 nm. The electrode layer 20 was likewise produced with a thickness of 100 nm by means of deposition by sputtering at a temperature of between 450° C. and 550° C.

Figure 2:
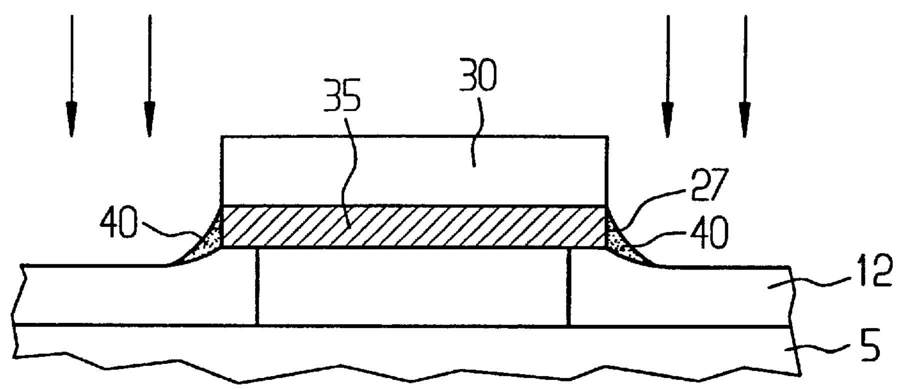
Figure 3:
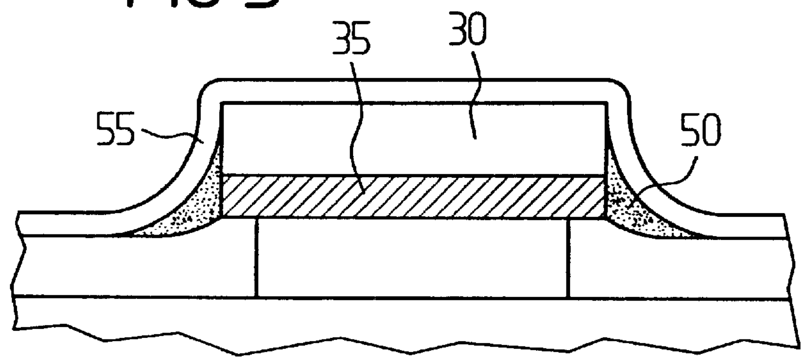

The structure illustrated in FIG. 1 is subsequently subjected to an etching process. For this purpose, first of all a suitable mask, for example a photoresist layer, is applied and patterned. Afterwards, the electrode layer 20 and the barrier layer 15 are etched by means of reactive ion etching in the presence of a chlorine plasma, the etching being carried out down to the TEOS layer 12 and up to a certain degree into the latter. In this case, material deposits 40, which are essentially formed by redeposited TEOS material, are produced at least in an edge region 27 of the resulting barrier 35 and partly in the edge region of the platinum electrode 30 situated above. The resultant structure is illustrated in FIG. 2. Other etching methods, for example using argon, may also be used. Relatively steep side walls are produced particularly argon is used in the etching process.

The insight that redeposited material on side walls of raised structures are partly eroded again by the etching process, and thus the side walls of the structures are not completely covered by the redeposited material, has been exploited in the course of the etching of the TEOS layer 12. As a result, the material deposits 40 are formed essentially in the lower region of the platinum electrode 30 and also completely in the region of the barrier 35, and that is to say that the material deposits 40 are produced laterally with respect to the etched barrier 35.

After the etching of the electrode layer 20 and of the barrier layer 12, the barium strontium titanate is deposited by means of a CVD process. For this purpose, the substrate 5 is introduced into a suitable CVD reactor and starting products in the form of diketonate complexes are fed to said reactor. In detail, $Ba(thd)_3$ (tetraglyme), $Sr(thd)_3$ (tetraglyme) and also $Ti(O\text{-}iPr)_3$ are used, thd denoting 2,2,6,6-tetramethyl-heptane-3,5-dionate, tetraglyme denoting tetraethylene glycol dimethyl ether and O-iPr denoting isopropoxide. Thd is a frequently used beta-diketonate which is outstandingly suitable for the CVD deposition of alkaline earth metals. These beta-diketonate complexes are frequently stabilized with tetraglyme. The starting materials are dissolved in butyl acetate and evaporated in a special evaporator at a temperature of approximately 245° C. Argon is used as the carrier gas. The starting materials evaporated in this way are mixed with the oxidizing gases oxygen and $N_2O$ in so-called shower heads of the CVD reactor.

The BST is deposited at a temperature of approximately 580° C., a deposition pressure of approximately 100 Pa prevailing. The gas flows set are approximately 500 sccm for oxygen, approximately 500 sccm for $N_2O$ and approximately 200 sccm for argon (sccm= standard cubic centimeters per minute), with the result that approximately 0.1 ml of the starting materials dissolved in butyl acetate is evaporated per minute. Under the above-mentioned process conditions, a BST layer 55 having a thickness of approximately 25 nm is formed within 200 seconds. This BST layer has the characteristics of an approximately 51% proportion by weight of titanium and a barium : strontium ratio of 70:30.

During the BST deposition, the amorphous passivation edge web 50 is formed in particular at the beginning of the deposition. This takes place essentially as a result of the reaction of the BST starting products with the redeposited material 40. The passivation edge web 50, which forms laterally between the barrier 35 and the BST layer 55, prevents oxidation of the barrier 35. The passivation edge web 50 formed, with circa 50 nm, is approximately twice as thick as the BST layer 55 and is essentially amorphous with individual crystalline regions. It is essentially composed of titanium oxide with proportions of barium, strontium, silicon and carbon. The proportion of barium and strontium is approximately 50% less than in the BST layer 55. In contrast to this, silicon and carbon could not be demonstrated in the BST layer 55.

Figure 4:
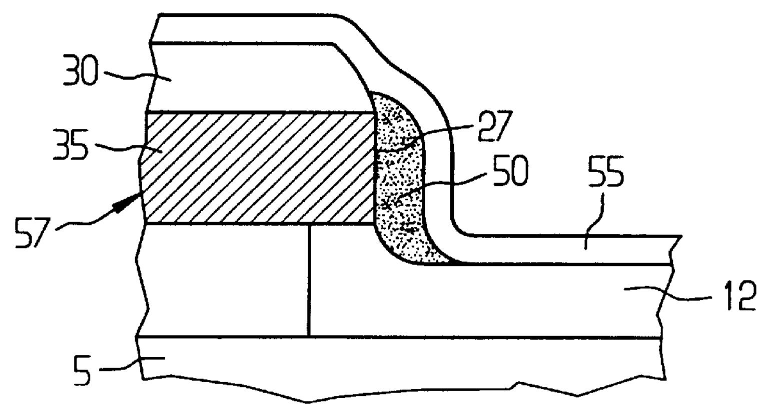
FIG. 4 is an enlarged detail of the edge region of a barrier layer.

FIG. 4 shows a somewhat enlarged detail of an edge region of a lower capacitor electrode 57. The latter comprises the platinum electrode 30 and also the barrier 35. In this exemplary embodiment, the barrier 35 is designed to be thicker than the platinum electrode 30, with the result that the passivation edge web 50 extends over more than half of the lower capacitor electrode 57. What is important is that the edge regions 27 of the barrier 35 are completely covered by the passivation edge web 50.

Figure 5:
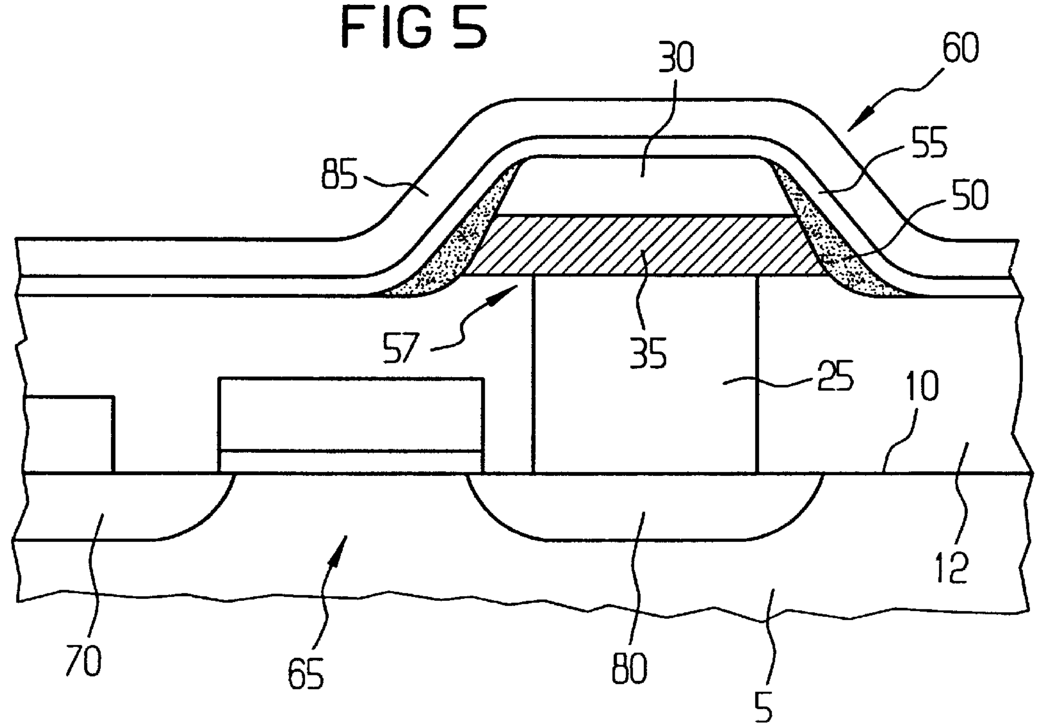
FIG. 5 a diagrammatic side view of a memory cell of a semiconductor memory device with passivation edge webs on the side regions of the storage capacitor.

A memory cell of a semiconductor memory device is illustrated in FIG. 5. The memory cell comprises a storage capacitor 60 and also a selection transistor 65. The latter is integrated in a substrate 5 with its source region 70 and its drain region 80. The TEOS layer 12 is applied on the surface 10 of the substrate 5. Seated on the TEOS layer is the storage capacitor 60 with a lower electrode 57 comprising a barrier 35 and also a platinum electrode 30, with a BST layer 55 and also with an upper electrode 85. The latter is likewise preferably composed of platinum. The drain region 80 and the lower electrode 57 are connected via a contact hole 25 filled with polysilicon. In order to prevent the diffusion of platinum or the diffusion of silicon, the polysilicon in the contact hole 25 is isolated from the platinum electrode 30 by the barrier 35. A self-aligned passivation edge web 50 formed in situ is arranged laterally with respect to the barrier 35. The material thickness of the passivation edge web is set such that, on the one hand, sufficient passivation of the barrier 35, that is to say an oxidation barrier, is ensured but, on the other hand, no additional space is required for the passivation edge web 50.

We claim:

1. A method for fabricating a capacitor, which comprises the following steps:

providing a substrate with a silicon-containing oxide layer formed from a material selected from the group consisting of TEOS and silicon nitride;

providing a barrier layer on the oxide layer, and an electrode layer on the barrier layer;

performing an etching process including etching, region by region, the electrode layer and the barrier layer, for forming at least one electrode of a capacitor;

during the etching process allowing the oxide layer underneath the barrier layer to be attacked up to a predetermined degree and allowing etching residues from the barrier layer to be formed at least in an edge region of the barrier layer;

CVD-depositing at least one metal in an oxidizing atmosphere and at a given deposition temperature to form a metal oxide layer, and thereby producing in situ a substantially amorphous passivation edge web from the etching residues and the at least one metal, in the course of the CVD deposition, laterally of the barrier layer between the barrier layer and the metal oxide layer.

2. The method according to claim 1, wherein the etching step comprises etching the electrode layer and the barrier layer in a common etching step.

3. The method according to claim 1, wherein the etching step comprises etching the electrode layer and the barrier layer in successive etching steps.

4. The method according to claim 1, which further comprises thermally annealing the metal oxide layer to form a polycrystalline layer.

5. The method according to claim 1, wherein the passivation edge web contains silicon and portions of metal deposited in the CVD-depositing step.

6. The method according to claim 1, which comprises etching the electrode layer and the barrier layer by reactive ion etching in the presence of chlorine.

7. The method according to claim 1, which comprises coordinating the given deposition temperature and the predetermined degree to which the oxide layer is attacked during the etching step such that the passivation edge web formed is approximately twice as thick as the metal oxide layer.

8. The method according to claim 1, which comprises using a mixture of metal and alkaline earth metal complexes containing beta-diketonates for depositing the metal oxide layer.

9. The method according to claim 8, which comprises forming the metal oxide layer from a material selected from the group consisting of barium strontium titanate and strontium bismuth tantalate.

10. The method according to claim 9, which comprises forming the passivation edge web of titanium oxide with proportions of silicon, carbon, barium and strontium, and adjusting the proportion of barium and strontium in the passivation edge web to approximately half a proportion of barium and strontium in the barium strontium titanate layer.

11. The method according to claim 8, which comprises adjusting the deposition temperature to between 400° C. and 600° C.

12. The method according to claim 1, which further comprises, subsequently to depositing the metal oxide layer, applying least one further electrode to the metal oxide layer.

* * * * *